United States Patent
Sun et al.

(10) Patent No.: US 11,070,022 B1
(45) Date of Patent: Jul. 20, 2021

(54) SECTOR-SHAPED CLOSELY-PACKED LASER

(71) Applicant: BWT Beijing Ltd., Beijing (CN)

(72) Inventors: Zongyuan Sun, Beijing (CN); Rui Liu, Beijing (CN); Juyun Zhao, Beijing (CN); Lei Xu, Beijing (CN)

(73) Assignee: BWT BEIJING LTD.

( * ) Notice: Subject to any disclaimer, the term of this patent is extended or adjusted under 35 U.S.C. 154(b) by 0 days.

(21) Appl. No.: 16/484,011

(22) PCT Filed: Oct. 9, 2018

(86) PCT No.: PCT/CN2018/109433
§ 371 (c)(1),
(2) Date: Aug. 6, 2019

(87) PCT Pub. No.: WO2020/062320
PCT Pub. Date: Apr. 2, 2020

(30) Foreign Application Priority Data

Sep. 29, 2018 (CN) .......................... 201811149249.3

(51) Int. Cl.
*H01S 5/00* (2006.01)
*H01S 5/02251* (2021.01)
(Continued)

(52) U.S. Cl.
CPC ...... *H01S 5/02251* (2021.01); *H01S 5/02253* (2021.01); *H01S 5/02326* (2021.01);
(Continued)

(58) Field of Classification Search
CPC ............. H01S 5/02251; H01S 5/02253; H01S 5/02469; H01S 5/4025; H01S 5/02326; H01S 5/24
See application file for complete search history.

(56) References Cited

U.S. PATENT DOCUMENTS

| 6,271,049 B1 * | 8/2001 | Auracher ............ H01S 5/02325 438/29 |
| 2005/0084201 A1 * | 4/2005 | Akashi ................. G02B 6/4279 385/14 |

(Continued)

FOREIGN PATENT DOCUMENTS

| CN | 1593817 A | 3/2005 |
| CN | 103944062 | 7/2014 |

(Continued)

*Primary Examiner* — Kinam Park
(74) *Attorney, Agent, or Firm* — Clark Hill PLC; James R. Foley

(57) ABSTRACT

The present disclosure discloses a sector-shaped closely-packed laser generator, comprising a module packaging unit and a closely-packed output unit; the module packaging unit is provided therein with a plurality of single-die modules, and each of the single-die modules has a coupling optical fiber; the closely-packed output unit is provided therein with a silicon wafer whose surface has a plurality of V-shaped grooves, and the plurality of V-shaped grooves are arranged into a sector shape; and the coupling optical fibers of the single-die modules protrude from the module packaging unit and enter the closely-packed output unit, and are arranged in the V-shaped grooves after coating layers being stripped, to emit laser lights in directions of the arrangement of the V-shaped grooves. In the present application, the plurality of single-die modules are collectively disposed in the module packaging unit, and the coupling optical fibers of the single-die modules are led out and arranged in the V-shaped grooves arranged in a sector shape, which realizes the close arrangement of the coupling optical fibers, obtains the effect of modularized and integrated packaging of single die, and effectively reduces the volume of the laser generator. Furthermore, by closely arranging the coupling optical fibers in the V-shaped grooves arranged in a sector shape, the present (Continued)

disclosure can control the light emitting direction of the coupling optical fibers.

10 Claims, 3 Drawing Sheets

(51) Int. Cl.
    *H01S 5/40*           (2006.01)
    *H01S 5/02253*       (2021.01)
    *H01S 5/024*          (2006.01)
    *H01S 5/02326*       (2021.01)
    *H01S 5/24*           (2006.01)

(52) U.S. Cl.
    CPC ............ *H01S 5/02469* (2013.01); *H01S 5/24* (2013.01); *H01S 5/4025* (2013.01)

(56) References Cited

U.S. PATENT DOCUMENTS

2005/0093013 A1\*   5/2005   Mastromatteo ..... H01S 5/02345
                                                                                257/100
2006/0239621 A1\*  10/2006   Lo ........................ G02B 6/4253
                                                                                 385/88

FOREIGN PATENT DOCUMENTS

CN           106300004 A     1/2017
CN           206818927 U    12/2017

\* cited by examiner

SECTOR-SHAPED CLOSELY-PACKED LASER

TECHNICAL FIELD

The present disclosure relates to the technical field of laser generators, and particularly relates to a sector-shaped closely-packed laser generator.

BACKGROUND

Because of the advantages such as the small volume, light weight and high efficiency, semiconductor laser generators have been the hot spot in the art of laser since their creation. The techniques for packaging semiconductor laser generators mostly develop and evolve on the basis of the techniques for packaging discrete devices, to realize and ensure the functions of the dies of working normally and outputting visible light. Along with the continuous upgrading of industry, demands of people increasingly grow, and the outputting and packaging form of single die in semiconductor laser generators cannot satisfy the usage demands at present. That is because the simple superposing of single die packaging cannot achieve the object of light weight and miniaturization, and the light emitting directions of the traditional single die packaging superposing solution are not diversified, which limits the popularization and application of new products of laser generators.

SUMMARY

In view of the problem that the laser generators in the prior art cannot be light weight and minimized, the present disclosure provides a sector-shaped closely-packed laser generator, to solve the above problem or at least partly solve the above problem.

In order to realize the above object, the present disclosure employs the following technical solution:

a sector-shaped closely-packed laser generator comprises a module packaging unit and a closely-packed output unit; the module packaging unit is provided therein with a plurality of single-die modules, and each of the single-die modules has a coupling optical fiber; the closely-packed output unit is provided therein with a silicon wafer whose surface has a plurality of V-shaped grooves, and the plurality of V-shaped grooves are arranged into a sector shape; and the coupling optical fibers of the single-die modules protrude from the module packaging unit and enter the closely-packed output unit, and are arranged in the V-shaped grooves after coating layers being stripped, to emit laser lights in directions of the arrangement of the V-shaped grooves.

Optionally, the single-die module further comprises: an electrode, a die, a single-module heat sink and a fast-axis collimating lens; the electrode electrically connects to the die; the single-module heat sink is of a step shape, and a positioning side rib is provided on one side of a first step of the single-module heat sink; the die clings to the positioning side rib and is mounted to the first step of the single-module heat sink, and a front end face of the die aligns with a boundary between the first step and a second step of the single-module heat sink; and the fast-axis collimating lens is mounted in front of the die, and the coupling optical fibers are configured to be aligned with the fast-axis collimating lens.

Optionally, in the single-die module, the die is fixed to the single-module heat sink by sintering by using a metal solder.

Optionally, the plurality of single-die modules are electrified and emit lights independently of each other.

Optionally, the plurality of single-die modules are disposed side by side in the module packaging unit, and all of the single-module heat sinks of the plurality of single-die modules are adhesively fixed to an outer housing of the module packaging unit, and respectively align with a rear end and a bottom of the outer housing of the module packaging unit.

Optionally, the module packaging unit is provided with an optical fiber mouthpiece, an optical fiber jacket is provided between the optical fiber mouthpiece and the closely-packed output unit, and the coupling optical fibers of the plurality of single-die modules pass through the optical fiber mouthpiece and the optical fiber jacket and protrude into the closely-packed output unit.

Optionally, the coupling optical fibers are arranged in the V-shaped grooves, and are fixed in the V-shaped grooves adhesively.

Optionally, light-emitting end faces of the coupling optical fibers are ground to be smooth.

Optionally, the V-shaped grooves are of a diverging shape, to cause output lights of the coupling optical fibers to be diverging lights; or, the V-shaped grooves are of a converging shape, to cause output lights of the coupling optical fibers to be converging lights.

Optionally, angles between the V-shaped grooves are equal; or, angles between the V-shaped grooves are configured to be gradually changing angles.

In conclusion, the advantageous effects of the present disclosure are:

The plurality of single-die modules are collectively disposed in the module packaging unit, and the coupling optical fibers of the single-die modules are led out and arranged in the V-shaped grooves arranged in a sector shape, which realizes the close arrangement of the coupling optical fibers, obtains the effect of modularized and integrated packaging of single die, and effectively reduces the volume of the laser generator. Furthermore, by closely arranging the coupling optical fibers in the V-shaped grooves arranged in a sector shape, the present disclosure can control the light emitting direction of the coupling optical fibers.

Figure 1:
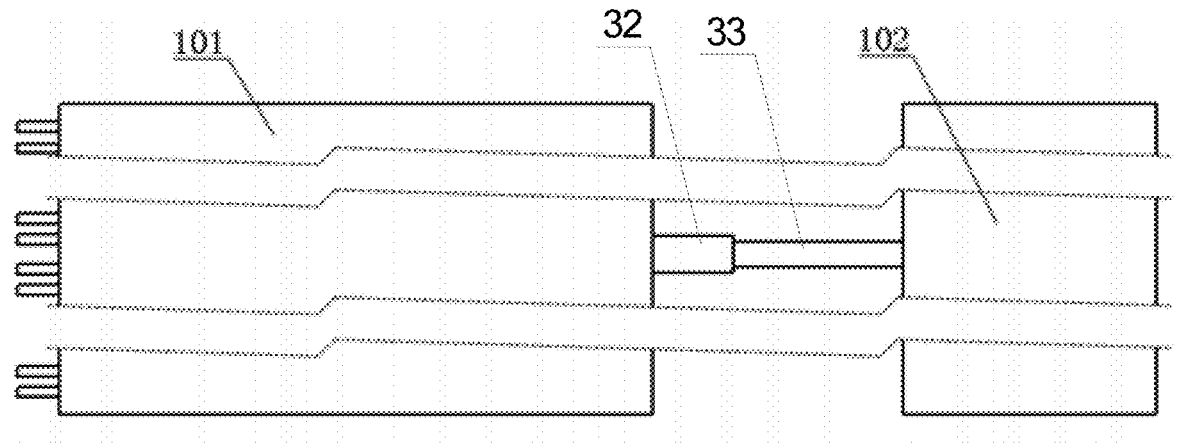
FIG. 1 is a schematic diagram of the overall structure of an embodiment of a sector-shaped closely-packed laser generator of the present disclosure.

in the drawings: 101. module packaging unit; 102. closely-packed output unit; 21. electrode; 22. single-module heat sink; 23. die; 24. fast-axis collimating lens; 25. coupling optical fibers; 26. positioning side rib; 31. lower housing of module packaging unit; 32. optical fiber mouthpiece; 33.

optical fiber jacket; 41. lower housing of closely-packed output unit; 42. silicon wafer; and 43. V-shaped grooves.

DETAILED DESCRIPTION

In order to make the objects, the technical solutions and the advantages of the present disclosure clearer, the embodiments of the present disclosure will be described below in further detail in conjunction with the drawings.

In the description of the present application, it should be noted that, the terms that indicate orientation or position relations, such as "central", "upper", "lower", "left", "right", "vertical", "horizontal", "inner" and "outer", are based on the orientation or position relations shown in the drawings, and are merely for conveniently describing the present disclosure and simplifying the description, rather than indicating or implying that the device or element must have the specific orientation and be constructed or operated according to the specific orientation. Therefore, they should not be construed as a limitation on the present application. Furthermore, the terms "first", "second" and "third" are merely used for the purpose of describing, and should not be construed as indicating or implying the degree of importance.

In the description of the present application, it should be noted that, unless explicitly defined or limited otherwise, the terms "install", "join" and "connect" should be interpreted broadly. For example, it may be fixed connection, detachable connection, or integral connection; it may be mechanical connection or electrical connection; and it may be direct connection or indirect connection by an intermediate medium, and may be the internal communication between two elements. A person skilled in the art can determine the particular meanings of the terms in the present application concretely.

The technical concept of the present disclosure is: a plurality of single-die modules are collectively disposed in a module packaging unit, and the coupling optical fibers of the single-die modules are led out and arranged in the V-shaped grooves arranged in a sector shape, to realize the close arrangement of the coupling optical fibers, obtain the technical effect of modularized and integrated packaging of single die, and effectively reduce the volume of the laser generator. Furthermore, by closely arranging the coupling optical fibers in the V-shaped grooves arranged in a sector shape, the present disclosure can control the light emitting direction of the coupling optical fibers.

Figure 2:
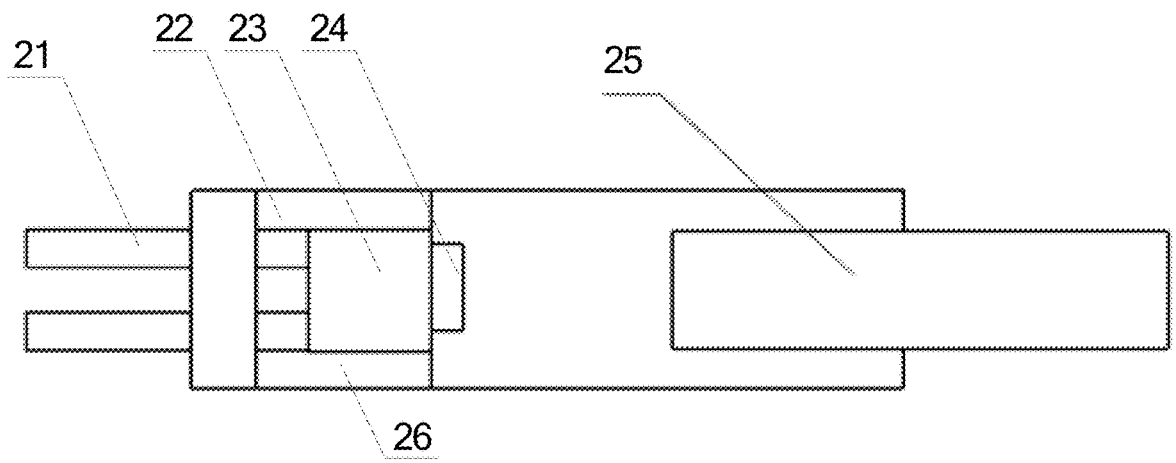
FIG. 2 is a schematic structural diagram of a single-die module of an embodiment of a sector-shaped closely-packed laser generator of the present disclosure.
Figure 3:
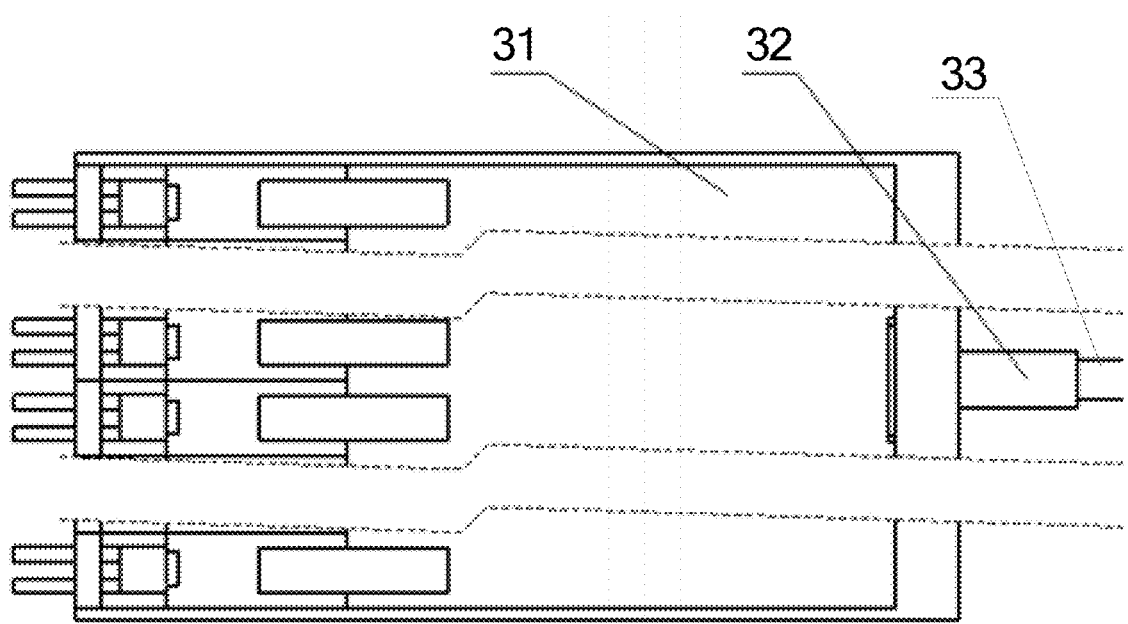
FIG. 3 is a schematic structural diagram of a module packaging unit of an embodiment of a sector-shaped closely-packed laser generator of the present disclosure.
Figure 4:
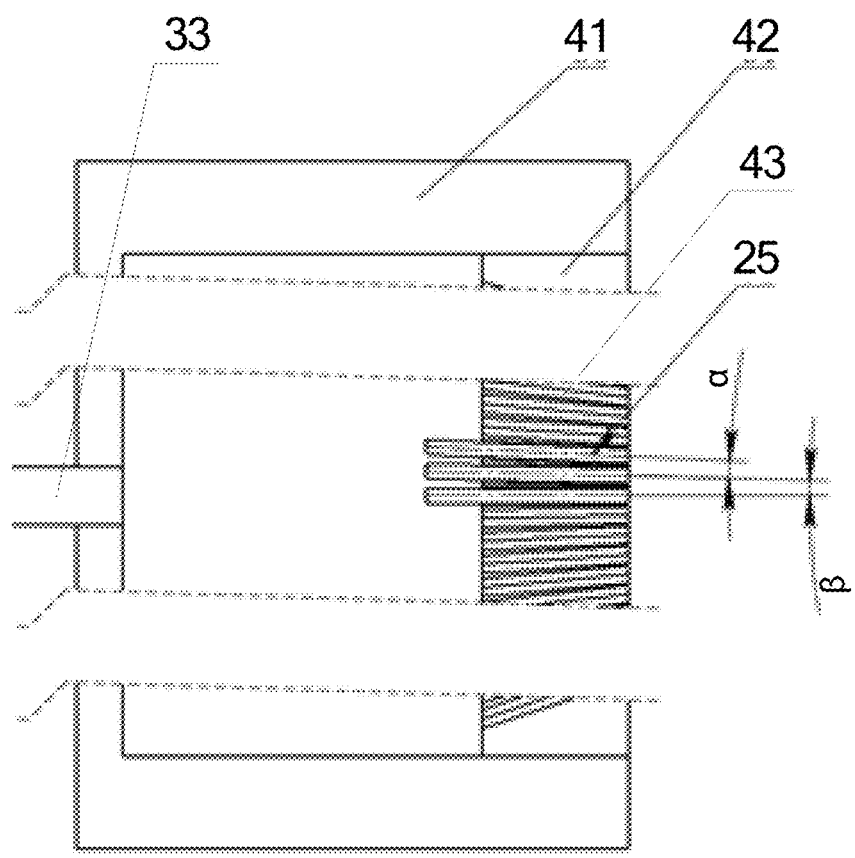
FIG. 4 is a schematic structural diagram of a converging light closely-packed output unit of an embodiment of a sector-shaped closely-packed laser generator of the present disclosure.
Figure 5:
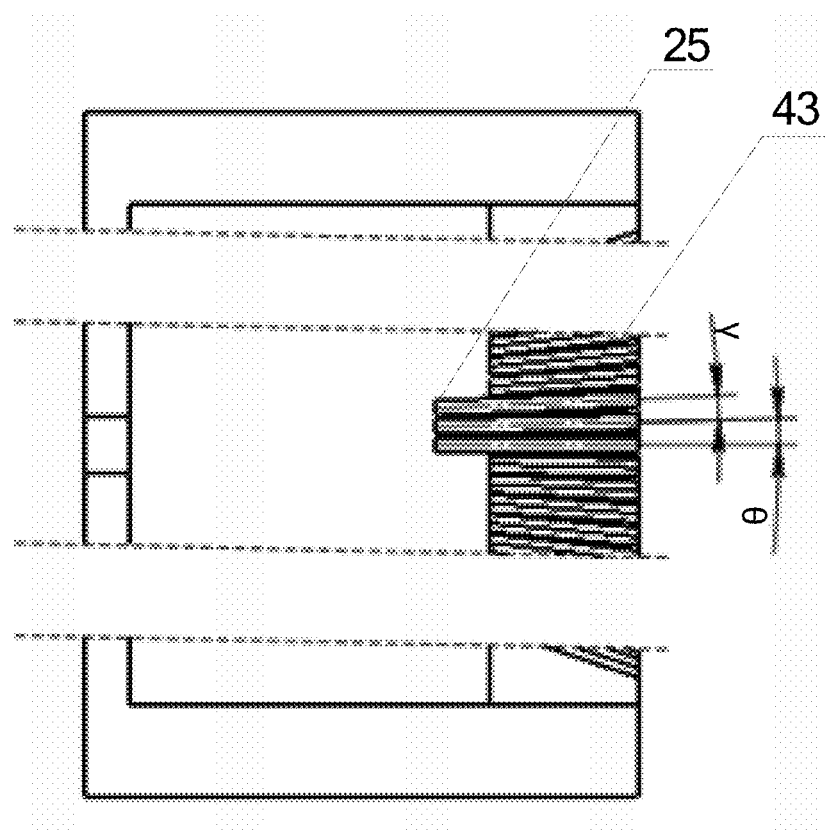
FIG. 5 is a schematic structural diagram of a diverging light closely-packed output unit of an embodiment of a sector-shaped closely-packed laser generator of the present disclosure.

FIGS. 1 to 7 disclose an embodiment of a sector-shaped closely-packed laser generator of the present application, wherein, FIG. 1 is a schematic diagram of the overall structure of an embodiment of a sector-shaped closely-packed laser generator of the present disclosure, FIG. 2 is a schematic structural diagram of a single-die module of an embodiment of a sector-shaped closely-packed laser generator of the present disclosure, FIG. 3 is a schematic structural diagram of a module packaging unit of an embodiment of a sector-shaped closely-packed laser generator of the present disclosure, FIG. 4 is a schematic structural diagram of a converging light closely-packed output unit of an embodiment of a sector-shaped closely-packed laser generator of the present disclosure, and FIG. 5 is a schematic structural diagram of a diverging light closely-packed output unit of an embodiment of a sector-shaped closely-packed laser generator of the present disclosure.

As shown in FIGS. 1 to 7, a sector-shaped closely-packed laser generator comprises a module packaging unit 101 and a closely-packed output unit 102. The module packaging unit 101 is provided therein with a plurality of single-die modules (see FIG. 2), and each of the single-die modules has a coupling optical fiber 25. The closely-packed output unit 102 is provided therein with a silicon wafer 42 whose surface has a plurality of V-shaped grooves 43 (see FIGS. 4 and 5), and the plurality of V-shaped grooves 43 are arranged into a sector shape. As shown in FIGS. 1, 4 and 5, the coupling optical fibers 25 of the single-die modules protrude from the module packaging unit 101 and enter the closely-packed output unit 102, and are arranged in the V-shaped grooves 43 after coating layers being stripped, to emit laser lights in directions of the arrangement of the V-shaped grooves 43.

Compared with the solution of single die packaging and superposing, the modularized packaging has the advantages of miniaturization and light weight. By parallelly arranging and collectively packaging a plurality of dies, stripping the coating layers on the outer side of the coupling optical fibers 25, and closely arranging the coupling optical fibers 25 to output laser lights, the laser light beams are more concentric, the volume of the laser generator is more compact, and the weight is smaller. Furthermore, the coupling optical fibers 25 are arranged in the V-shaped grooves 43, which can realize light emitting by the laser generator in the directions of the arrangement of the V-shaped grooves 43, and can control the light emitting direction of the laser generator. Because closely-arranged outputting is realized, the present disclosure is not limited by the beam parameter product (for short BPP, a parameter that describes the product of the size and the angle of the light-emitting zone of a chip) of the die 23, and can realize the multi-beam outputting of a plurality of single-die modules.

As shown in FIG. 2, besides the coupling optical fibers 25, the single-die module further comprises: an electrode 21, a die 23, a single-module heat sink 22 and a fast-axis collimating lens 24.

The electrode 21 electrically connects to the die 23, thereby electrifying the die 23 by using the electrode 21, to excite the die 23 to emit light. The single-module heat sink 22 is of a step shape, which facilitates positioning and mounting optical elements such as the die 23, wherein the lengths of the steps are determined according to the geometrical sizes and mounting positions of the optical elements to be mounted. A positioning side rib 26 is provided on one side of the first step of the single-module heat sink 22, wherein the positioning side rib 26 serves as the positioning reference to facilitate the mounting and positioning of the die 23. The die 23 clings to the positioning side rib 26 and is mounted to the first step of the single-module heat sink 22, and the front end face of the die 23 aligns with the boundary between the first step and the second step of the single-module heat sink 22.

The fast-axis collimating lens 24 is mounted in front of the die 23. Because the divergence angle of the light beam emitted by the die 23 is usually relatively large in the fast-axis direction (40~60 degrees), which is quite greater than the divergence angle in the slow-axis direction (6~12 degrees), the output light beam of a single die 23 is required to be collimated only in fast-axis. Particularly, by using a high-accuracy finely adjusting rack and an adhesive, the fast-axis collimating lens (FAC) 24 is mounted in front of the die 23, as shown in FIG. 2, to collimate the light beam of the die 23 in the fast-axis direction, by inspecting the position and size of the far-field facula of the light beam, the collimation degree in the fast-axis direction is observed, and after the collimation degree meets the requirement, the fast-axis collimating lens is fixed on the die 23 by using a solidifying glue.

The coupling optical fibers 25 are configured to be aligned with the fast-axis collimating lens 24. In some embodiments of the present application, the coupling optical fibers 25 are coupling optical fibers having an end face lens, but they are not limited thereto, and may also be coupled lens and optical fibers that are coaxially packaged. In installation, by using a high-accuracy finely adjusting rack and a glue, the optical path of the laser lights is regulated entirely, the tail end of the coupling optical fibers 25 connects to an integrating sphere (integrating sphere refers to a hollow sphere whose inner wall is coated with a white diffuse reflection material, which is also referred to as a photometric sphere, a luminous flux sphere and so on, and can be used to measure parameters such as optical efficiency and radiation angle), and when the laser power reaches a certain numerical value, the coupling optical fibers 25 are fixed by using the glue.

In the single-die module of the present embodiment, the die 23 is fixed to the single-module heat sink 22 by sintering by using a metal solder, to ensure good thermal conduction, so that the single-module heat sink 22 can quickly dissipate the heat generated by the operation of the die 23.

In the present embodiment, the plurality of single-die modules are electrified and emit lights independently of each other; that is, each of the dies has the function of independent controlling, which can enable the sector-shaped closely-packed laser generator of the present application to output diversified laser light beams.

In the present embodiment, the plurality of single-die modules are disposed side by side in the module packaging unit 101, and all of the single-module heat sinks 22 of the plurality of single-die modules are adhesively fixed to an outer housing of the module packaging unit 101, and respectively align with a rear end and a bottom of the outer housing of the module packaging unit 101, thereby ensuring that the plurality of single-die modules are aligned side by side. As shown in FIG. 3, all of the single-module heat sinks 22 of the plurality of single-die modules align with the rear end of the lower housing 31 of the module packaging unit, and cling to the bottom of the lower housing 31 of the module packaging unit.

In the present embodiment, as shown in FIG. 3, the module packaging unit 101 is provided with an optical fiber mouthpiece 32, an optical fiber jacket 33 is provided between the optical fiber mouthpiece 32 and the closely-packed output unit 102, and the coupling optical fibers 25 of the plurality of single-die modules pass through the optical fiber mouthpiece 32 and the optical fiber jacket 33 and protrude into the closely-packed output unit 102. By using the collective optical fiber mouthpiece 32 and optical fiber jacket 33 to comb and integrate the plurality of coupling optical fibers 25, the connection structure is tidy, and that has good protecting function for the coupling optical fibers 25.

In that, the length of the coupling optical fibers 25 that protrudes out of the optical fiber mouthpiece 32 is properly tailored according to the requirement on for example the size of the laser generator, to reserve a proper length for the closely-arranged outputting of the optical fibers.

In the installation process of the present embodiment, as shown in FIGS. 4 and 5, firstly the silicon wafer 42 is adhesively connected to the lower housing 41 of the closely-packed output unit, then the coating layers on the outer side of the coupling optical fibers 25 are stripped, the coupling optical fibers 25 and the silicon wafer 42 are cleaned up, and then the coupling optical fibers 25 are arranged in the V-shaped grooves 43, and are fixed in the V-shaped grooves 43 adhesively, thereby realizing the close arrangement of the coupling optical fibers 25.

In the closely-packed output unit shown in FIG. 4 of the present embodiment, the V-shaped grooves 43 are of a converging shape, the V-shaped grooves 43 are arranged rightwardly in a converging shape, the right ends of the V-shaped grooves 43 are closely adjacent, and the neighboring V-shaped grooves form preset angles $\alpha$ and $\beta$ therebetween, to cause the output lights of the coupling optical fibers 25 to be converging lights. In that, the angles $\alpha$ and $\beta$ between the neighboring V-shaped grooves 43 are set according to the usage demands. The converging laser lights have a further irradiation distance, which facilitates improving the scanning distance of the sector-shaped closely-packed laser generator, and improving the penetrating power of the laser lights.

In the closely-packed output unit shown in FIG. 5 of the present embodiment, the V-shaped grooves 43 are of a diverging shape, the left ends of the V-shaped grooves 43 are closely adjacent, the V-shaped grooves 43 are arranged rightwardly in a diverging shape, and the neighboring V-shaped grooves form preset angles $\gamma$ and $\theta$ therebetween, to cause the output lights of the coupling optical fibers 25 to be diverging lights. In that, the angles $\gamma$ and $\theta$ between the neighboring V-shaped grooves 43 are set according to the usage demands. The diverging laser lights have a larger irradiation area, which facilitates improving the scanning speed of the sector-shaped closely-packed laser generator.

In a preferable embodiment of the present application, after the coupling optical fibers 25 are fixed within the V-shaped grooves 43 adhesively, the light-emitting end faces of the coupling optical fibers 25 are further required to be ground, to ensure the tidiness of the light-emitting end faces, to further improve the light emitting effect.

In the present embodiment, the angles between the V-shaped grooves 43 are equal; or, the angles between the V-shaped grooves 43 are configured to be gradually changing angles, to enable the V-shaped grooves 43 to contract or expand at a proper speed.

In the present embodiment, the quantity of the V-shaped grooves 43 is greater than the quantity of the coupling optical fibers 25. Therefore, the present disclosure may conveniently add more single-die modules, and arrange more coupling optical fibers 25 in the redundant V-shaped grooves 43, to enhance the output capability of the laser generator.

In the present embodiment, each of the outer housings of the module packaging unit and of the closely-packed output unit comprises a lower housing and an upper housing that are spliced, wherein the lower housing and the upper housing are fixed adhesively.

In the sector-shaped closely-packed laser generator of the present application, each of the single-die modules is equivalent to one complete single-die semiconductor laser generator. Because in the present application, the dies are collectively packaged in the sector-shaped closely-packed laser generator, and the coupling optical fibers corresponding to the dies are closely-arranged outputted by using the V-shaped grooves arranged in a sector shape, so that the laser generator has smaller volume and weight, on the basis of realizing multi-channel laser light emitting, the present disclosure facilitates controlling the light emitting direction, and realizing polydirectional light emitting. Furthermore, the modularized packaging mode can be easily expanded, which facilitates expanding to more channels of laser lights that are simultaneously outputted.

The description above is merely particular embodiments of the present disclosure. By the foregoing teachings of the present disclosure, a person skilled in the art may make other improvements or modifications based on the foregoing embodiments. A person skilled in the art should understand that, the particular description above is merely for better explaining the present disclosure, and the protection scope of the present disclosure should be subject to the protection scope of the claims.

What is claimed is:

1. A sector-shaped closely-packed laser generator, wherein the sector-shaped closely-packed laser generator comprises a module packaging unit and a closely-packed output unit; the module packaging unit is provided therein with a plurality of single-die modules, and each of the single-die modules has a coupling optical fiber; the closely-packed output unit is provided therein with a silicon wafer whose surface has a plurality of V-shaped grooves, and the plurality of V-shaped grooves are arranged into a sector shape; and the coupling optical fibers of the single-die modules protrude from the module packaging unit and enter the closely-packed output unit, and are arranged in the V-shaped grooves after coating layers being stripped, to emit laser lights in directions of the arrangement of the V-shaped grooves.

2. The sector-shaped closely-packed laser generator according to claim 1, wherein the single-die module further comprises: an electrode, a die, a single-module heat sink and a fast-axis collimating lens; the electrode electrically connects to the die; the single-module heat sink is of a step shape, and a positioning side rib is provided on one side of a first step of the single-module heat sink; the die clings to the positioning side rib and is mounted to the first step of the single-module heat sink, and a front end face of the die aligns with a boundary between the first step and a second step of the single-module heat sink; and the fast-axis collimating lens is mounted in front of the die, and the coupling optical fibers are configured to be aligned with the fast-axis collimating lens.

3. The sector-shaped closely-packed laser generator according to claim 2, wherein, in the single-die module, the die is fixed to the single-module heat sink by sintering by using a metal solder.

4. The sector-shaped closely-packed laser generator according to claim 2, wherein the plurality of single-die modules are electrified and emit lights independently of each other.

5. The sector-shaped closely-packed laser generator according to claim 2, wherein the plurality of single-die modules are disposed side by side in the module packaging unit, and all of the single-module heat sinks of the plurality of single-die modules are adhesively fixed to an outer housing of the module packaging unit, and respectively align with a rear end and a bottom of the outer housing of the module packaging unit.

6. The sector-shaped closely-packed laser generator according to claim 1, wherein the module packaging unit is provided with an optical fiber mouthpiece, an optical fiber jacket is provided between the optical fiber mouthpiece and the closely-packed output unit, and the coupling optical fibers of the plurality of single-die modules pass through the optical fiber mouthpiece and the optical fiber jacket and protrude into the closely-packed output unit.

7. The sector-shaped closely-packed laser generator according to claim 1, wherein the coupling optical fibers are arranged in the V-shaped grooves, and are fixed in the V-shaped grooves adhesively.

8. The sector-shaped closely-packed laser generator according to claim 1, wherein light-emitting end faces of the coupling optical fibers are ground to be smooth.

9. The sector-shaped closely-packed laser generator according to claim 1, wherein the V-shaped grooves are of a diverging shape, to cause output lights of the coupling optical fibers to be diverging lights; or, the V-shaped grooves are of a converging shape, to cause output lights of the coupling optical fibers to be converging lights.

10. The sector-shaped closely-packed laser generator according to claim 1, wherein angles between the V-shaped grooves are equal; or, angles between the V-shaped grooves are configured to be gradually changing angles.

* * * * *